*(12)* United States Patent
Johnson

(10) Patent No.: US 8,555,127 B2
(45) Date of Patent: Oct. 8, 2013

(54) SELF-TIMED ERROR CORRECTING CODE EVALUATION SYSTEM AND METHOD

(71) Applicant: Micron Technology, Inc., Boise, ID (US)

(72) Inventor: James B. Johnson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/731,658

(22) Filed: Dec. 31, 2012

(65) Prior Publication Data

US 2013/0117628 A1 May 9, 2013

Related U.S. Application Data

(62) Division of application No. 11/958,150, filed on Dec. 17, 2007, now Pat. No. 8,347,165.

(51) Int. Cl.
*H04L 1/14* (2006.01)
*H03M 13/00* (2006.01)
*G11C 29/00* (2006.01)

(52) U.S. Cl.
USPC ..................... 714/750; 714/758; 714/763

(58) Field of Classification Search
None
See application file for complete search history.

(56) References Cited

U.S. PATENT DOCUMENTS

| | | | |
|---|---|---|---|
| 4,450,561 A | 5/1984 | Gotze et al. |
| 4,994,993 A | 2/1991 | Asghar et al. |
| 5,208,490 A | 5/1993 | Yetter |
| 6,801,056 B2 | 10/2004 | Forbes |
| 6,901,000 B1 | 5/2005 | Ichiriu et al. |
| 7,246,259 B2 | 7/2007 | Subbarao et al. |
| 7,840,876 B2 | 11/2010 | Sturm et al. |
| 2006/0109712 A1 | 5/2006 | Conley et al. |
| 2008/0168331 A1 | 7/2008 | Vogelsang et al. |
| 2009/0158111 A1 | 6/2009 | Johnson |
| 2011/0185119 A1 | 7/2011 | Madpuwar |
| 2013/0179758 A1 | 7/2013 | Hwang et al. |

OTHER PUBLICATIONS

Related U.S. Appl. No. 13/348,447, filed Jan. 11, 2012.
Non-Final Office Action issued by the State Intellectual Property Office on May 9, 2012 for Chinese Patent Application No. 200880121034.1, 1-7.
International Search Report and Written Opinion dated Jun. 30, 2009 for PCT Application No. PCT/US2008/084708.
Office Action in Korean Application No. 10-2010-7015890 dated Nov. 25, 2011.
Kidiyarova-Shevchenko, Anna Yu. et al., "RSFQ Asynchronous Serial Multiplier and Spreading Codes Generator for Multiuser Detector", IEEE Transactions on Applied Superconductivity, vol. 13, No. 2, Jun. 2003.
Office action and Search Report dated Jan. 28, 2013 received for TW Application No. 097147528.
Yu, et al., "RSFQ Asynchronous Serial Multiplier and Spreading Codes Generator for Multiuser Detector", IEEE Transactions on Applied Superconductivity vol. 13, No. 2, Jun. 2003, 429-432.

*Primary Examiner* — Guerrier Merant
(74) *Attorney, Agent, or Firm* — Dorsey & Whitney LLP

(57) ABSTRACT

Error correcting codes (ECCs) have been proposed to be used in high frequency memory devices to detect errors in signals transmitted between a memory controller and a memory device. For high frequency memory devices, ECCs have delay characteristics of greater than one clock cycle. When the delay exceeds one clock cycle but is much less than two clock cycles, an entire second clock cycle must be added. By calculating and comparing the ECC value in a static logic circuit and a dynamic logic circuit, the logic delay is substantially reduced. In addition, the ECC value may be calculated and compared using two sets of static logic gates, where the second static logic gate is clocked by a clock signal that is delayed relative to the clock signal of the first set of logic gates.

20 Claims, 9 Drawing Sheets

SELF-TIMED ERROR CORRECTING CODE EVALUATION SYSTEM AND METHOD

CROSS-REFERENCE TO RELATED APPLICATION

This application is a divisional of U.S. patent application Ser. No. 11/958,150, filed Dec. 17, 2007, and issued as U.S. Pat. No. 8,347,165. This application and patent are incorporated by reference herein in their entirety and for all purposes.

TECHNICAL FIELD

This invention is directed toward the use of error correcting code within memory systems, and, more particularly, one or more embodiments of this invention relates to decreasing the logic delay associated with calculating and comparing an error correcting code in command, address and data signals coupled between components in memory systems.

BACKGROUND OF THE INVENTION

In memory devices, such as dynamic random access memory (DRAM), as data channel frequencies increase, maintaining signal integrity becomes more important. Thus, error correcting codes (ECCs), such as cyclical redundancy check (CRC), have been proposed for use in high frequency memory devices to detect errors in signals transmitted between a memory controller and a memory device.

In a memory device, ECCs may be transmitted between a memory controller and the memory device along with command, address and data signals. The signals may be serialized into a packet and transferred along a channel. In a write command, once a packet is received by the memory device, an ECC value is calculated and compared with a known ECC value that was transmitted in the packet. If the values are the same, the command, address, and write data signals are validated and access is provided to a memory array in the memory device. Conversely, if the calculated ECC value is different from the known ECC value, then the command signal in the packet is suppressed and the write data is not sent to the memory array.

FIG. 1 shows a block diagram of a logic path 100 for calculating and comparing an ECC value in a high frequency memory device in accordance with the prior art. The logic path 100 for calculating the ECC value includes two static logic gates 102 and 106 that are clocked by respective flip flops 104 and 108. More particularly, a packet is captured by a latch 122 responsive to an input capture clock. The command signals for the write command are sent to a command decoder 110. In addition, the command signals, address signals and write data signals are sent to a set of first static logic gates (SL 1) 102. For example, if 16 bits are captured, 4 command bits would be sent to the command decoder and all 16 bits would be sent to the SL1 102. The SL1 102 completes a first part of the ECC calculation by generating a partial sum of the terms. The partial sum of the terms is output from the SL1 102, and latched into a first flip flop 104. The partial sum is output from the first flip flop 104 and provided to a second set of static logic gates (SL2) 106. The remainder of the ECC calculation is completed in the SL2 106. Moreover, the calculated ECC is compared with the transmitted ECC in the SL2 106. When the calculated ECC value matches the transmitted ECC value, the SL2 106 generates an ECC valid signal. From the SL2 106, the ECC valid signal is latched into a second flip flop 108 before being provided to an ECC valid logic gate 120.

In parallel, a command decoder 110 decodes the command signals in the packet. The decoded command signals are clocked by a first and second flip flop 114 and 118, respectively, so that the decoded command signal can be provided to the ECC valid logic gate 120 at the same time the ECC valid signal is provided to the ECC valid logic gate 120. Thus, the decoded command signals are clocked out of the second flip flop 118 at about the same time as the ECC valid signal is clocked out of the second flip flop 108. The ECC valid logic gate 120 validates the command and provides access to the memory array (not shown) when the calculated ECC value is the same as the transmitted ECC value. Conversely, the ECC valid logic gate 120 suppresses the command, when the calculated ECC value is different from the transmitted ECC value.

A timing diagram showing the delay for the logic path 100 of FIG. 1 is show in FIG. 2. In FIG. 2, at time T0 the signals on the packet that are applied to input terminals become valid. At time T1 and in response to a rising edge of the clock signal, the signals are captured and provided to the SL1 102 (FIG. 1). The partial sum of terms is output from the SL1 102 at time T2, which is some time period greater than a half period of the clock signal shown at the top of FIG. 2. At time T3 and in response to a rising edge of the clock signal, the partial sum of terms is clocked into the first flip flop 104 and provided to the SL2 106. The ECC valid signal is output from SL2 106 at time T4 and provided to the second flip flop 108, which, again, requires a time period greater than a half period of the clock signal for the SL2 106 to output the ECC valid signal. At time T5 and in response to a rising edge of the clock signal, the ECC valid signal is clocked into the second flip flop 108, and the decoded command signal is clocked out of the second flip flop 118. At time T6 the decoded command signal and ECC valid signal are provided to the ECC valid logic gate 120. The ECC valid logic gate 120 generates an array command signal at time T7. The array command signal provides access to the memory array.

It can be seen from FIG. 2 that it requires two clock periods (i.e., T1-T5) after the packet is applied to the memory device to validate the command signals in the packet. The signals from the SL1 102 cannot be clocked into the first flip flop 104 by the falling edge of the clock signal after T1 because the SL1 102 requires more than one half period to complete its calculation. For the same reason, the signals from the SL2 106 cannot be clocked into the second flip flop 108 by the falling edge of the clock signal following T3. Yet considerable time is wasted after the SL1 102 and SL2 106 complete their calculations, and the signals from the SL1 102 and the SL2 106 are clocked into the flip flops 104 and 108, respectively, at time T3 and T5, respectively.

For high frequency clock speeds, the prior art method shown in FIG. 1 for calculating ECC calculations has delay characteristics greater than one internal memory device clock cycle. When the ECC delay exceeds one clock period, a second clock period delay must be added to the delay to align the ECC calculation with the command signals to validate the command before accessing the memory array. Therefore, when the ECC logic delay is greater than one clock cycle but much less than two clock cycles, an entire second clock period delay is added.

One solution in the prior art for minimizing the delay associated with calculating and comparing the ECCs values has been to slow down the frequency of the internal memory clock cycle. By slowing down the clock frequency, the calculation and comparison of the ECC can be done in less time. In particular, the SL1 102 can complete its calculation by the falling edge following the rising edge that clocks the signals into the latch 122. Similarly, the SL2 106 can complete its calculation by the falling edge following the rising edge that clocks the signals into the first flip flop 104. As a result, the calculation and comparison can be done in one clock cycle, rather than having to extend it into two clock cycles. This is not a desirable solution, however, as it reduces the bandwidth of the memory device.

Therefore, there is a need for decreasing the logic delay associated with calculating and comparing ECCs without reducing the clock frequency.

DETAILED DESCRIPTION

Embodiments of the present invention are directed toward, for example, providing a method of reducing the logic delay associated with calculating ECCs. Certain details are set forth below to provide a sufficient understanding of the embodiments of the invention. However, it will be clear to one skilled in the art that various embodiments of the invention may be practiced without these particular details.

Figure 3:
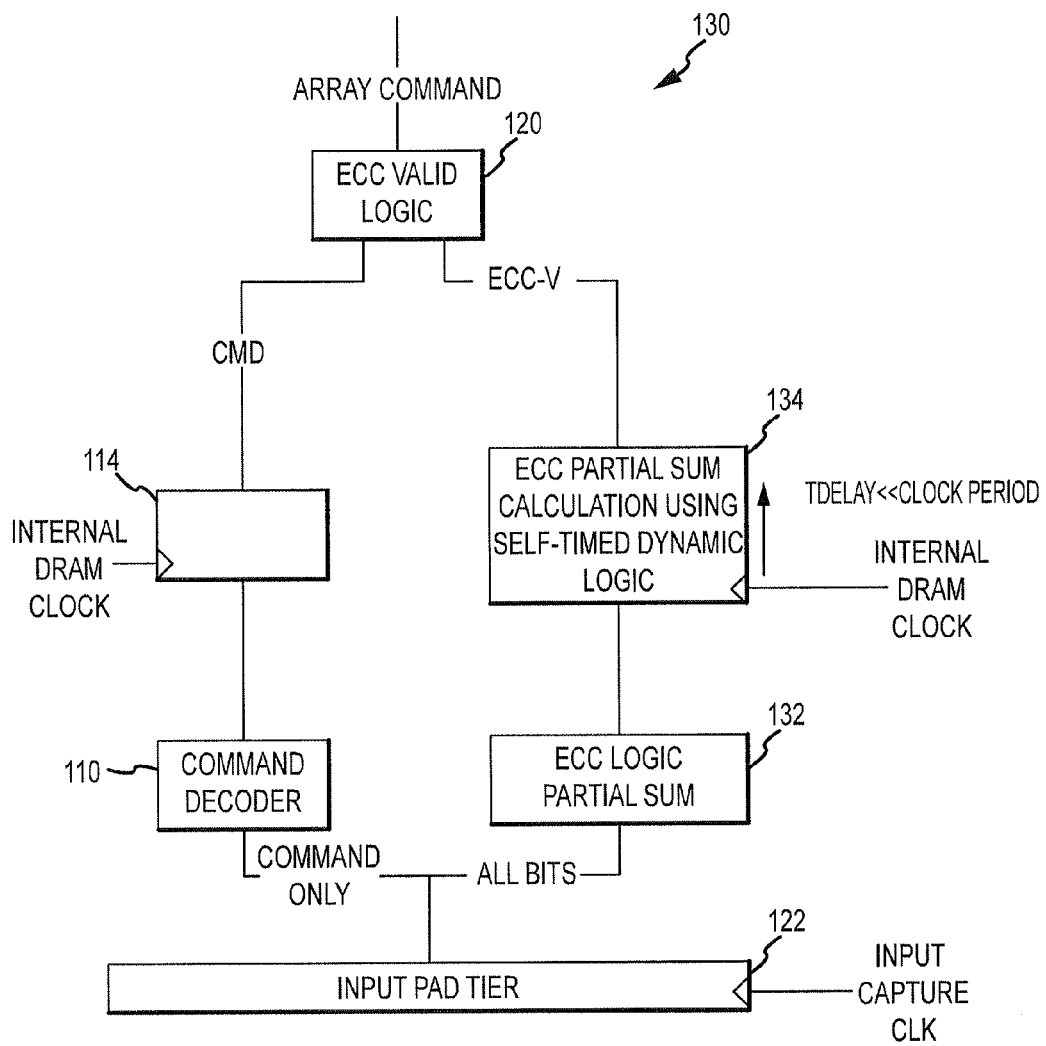
FIG. 3 is a block diagram of a logic path for calculating an error code according to one embodiment of the invention.

FIG. 3 shows a block diagram of a logic path 130 for calculating an error code according to one embodiment of the invention. In a write command, the logic path 130 captures a packet and distributes the incoming signals to a command decoder 110 and a set of static logic gates 132 in the same manner in FIG. 3 as in FIG. 1. Therefore, in the interest of brevity, an explanation of the process will not be repeated. The set of static logic gates 132 are similar to the first set of static logic gates 102 in FIG. 1 in that the set of logic gates 132 calculates a partial sum of terms. The logic path 130 of FIG. 3 differs from the logic path 100 of FIG. 1 by completing the ECC calculation and comparing the calculated ECC value with the transmitted ECC value in a set of dynamic logic gates 134. As in the prior art of FIG. 1, if the calculated ECC value is valid, a valid signal is sent from the dynamic logic gates 134 to the ECC valid logic gate 120. The ECC valid logic gate 120 validates the command before providing it to the memory array (not shown). As previously stated, the ECC valid logic 120 suppresses the decoded command if the calculated ECC value does not match the transmitted ECC value or generates an array command and thus, provides access to the memory array if the calculated ECC value does match the transmitted ECC value.

Figure 4:
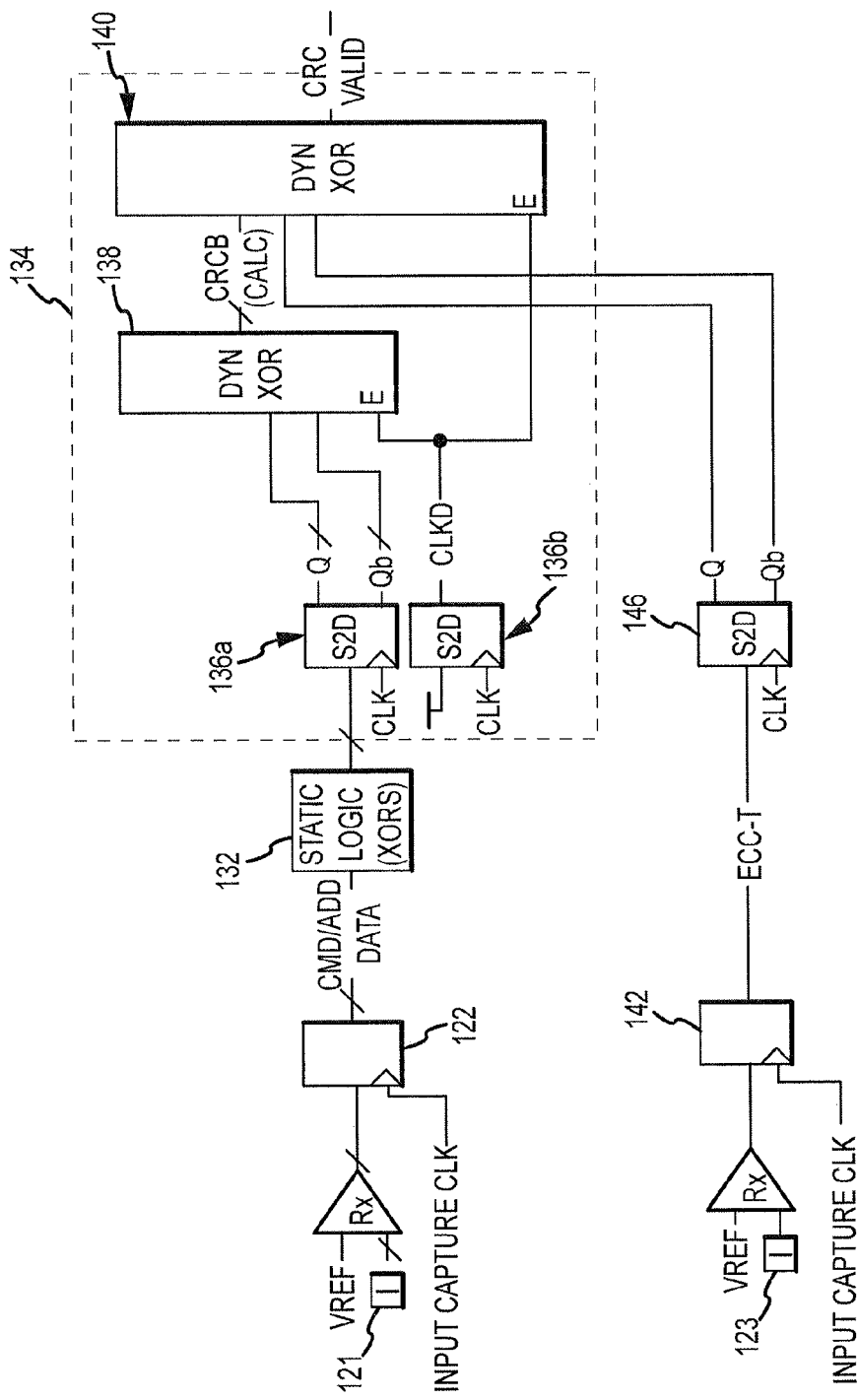
FIG. 4 is a more detailed block diagram of the logic path of FIG. 3 according to one embodiment of the invention.

FIG. 4 is a detailed block diagram of the logic path 130 in FIG. 3. A first input 121 receives the command, address, and data bits from a packet transmitted across a channel. The command, address, and data bits are clocked by latch 122 and provided to the set static logic exclusive-OR (XOR) gates 132, which calculates a partial sum of the terms of the calculated ECC. The partial sum of the terms is then provided to the dynamic logic 134. In particular, the partial sum of the terms is first provided to a set of static to dynamic circuits (S2Ds) 136a. In addition, S2D 136b is provided to align an output CLKD to the outputs from the S2D 136a. The S2Ds 136a convert the partial sum of the terms into monotonically rising output signals, which allows functional completeness for downstream logic. Monotonic signals travel in one direction during each evaluation cycle, for example from low to high. The output signals Q and Qb are complementary so that one of them may transition high each clock cycle. When the Q signal is high, the first set of dynamic XOR gates 138 and a second set of dynamic XOR gates 140 are enabled. When the dynamic XOR gates 138 and 140 are enabled, the remaining ECC calculation and comparison is completed without regard to a clock cycle. More particularly, the logic in the two sets of dynamic XOR gates 138 and 140 is completed as the signals are received in the respective gates, rather than relative to a clock cycle. Therefore, the time it takes to calculate the remaining part of the ECC value and compare the calculated ECC value with the transmitted ECC value is determined by the dynamic logic delay rather than by clock period. This dynamic logic delay is less than a clock cycle and thus is completed faster than the delay associated with the prior art.

In parallel with the above, input 123 receives the transmitted ECC value from the packet and is clocked by flip flop 142. The transmitted ECC value is provided to an S2D circuit 146. The transmitted ECC value is further provided to the second set of dynamic XOR gates 140. As stated above, the calculated ECC value in the first set of dynamic XOR gates 138 is provided to the second set of dynamic XOR gates 140. In the second set of dynamic XOR gates 140, the calculated ECC value is compared with the transmitted ECC value. If the calculated ECC value matches the transmitted ECC value, an ECC valid command is provided to ECC valid logic 120. There is no delay associated with aligning the decoded command signals with the ECC valid signal as they are provided to the ECC valid logic 120. Rather, the decoded command signals may be provided to the ECC valid logic 120 at a different time than the ECC valid signal.

Figure 1:
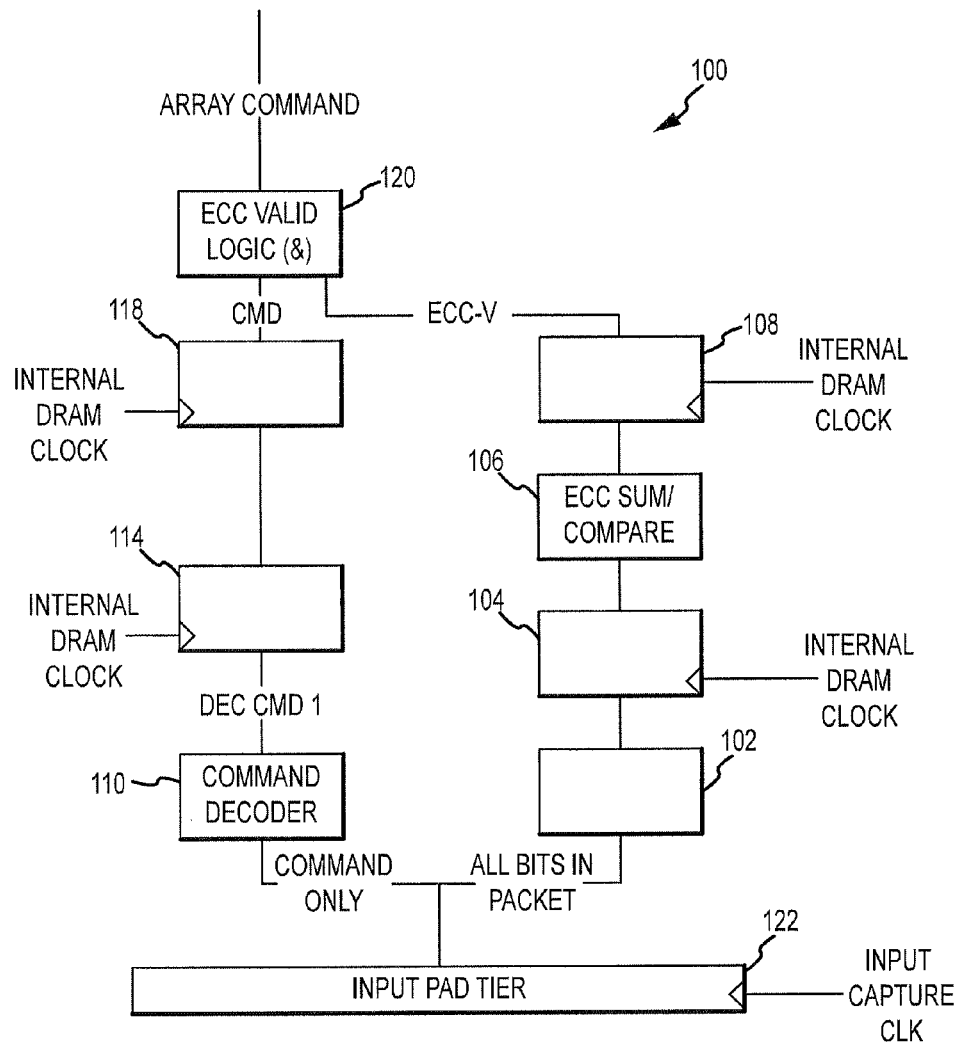
FIG. 1 is a block diagram of a logic path for calculating an error code in accordance with prior art.
Figure 2:
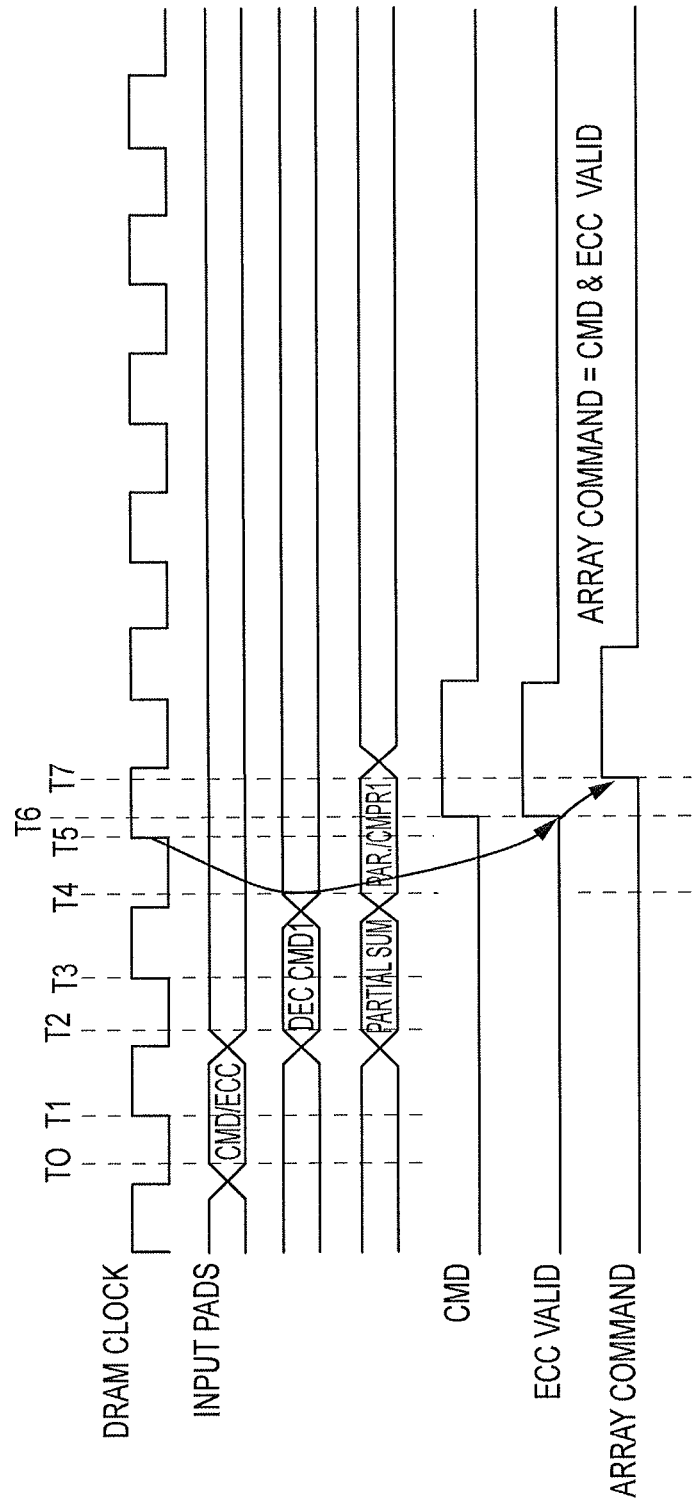
FIG. 2 is a timing diagram representative of the time to calculate error code value in accordance with prior art.
Figure 5:
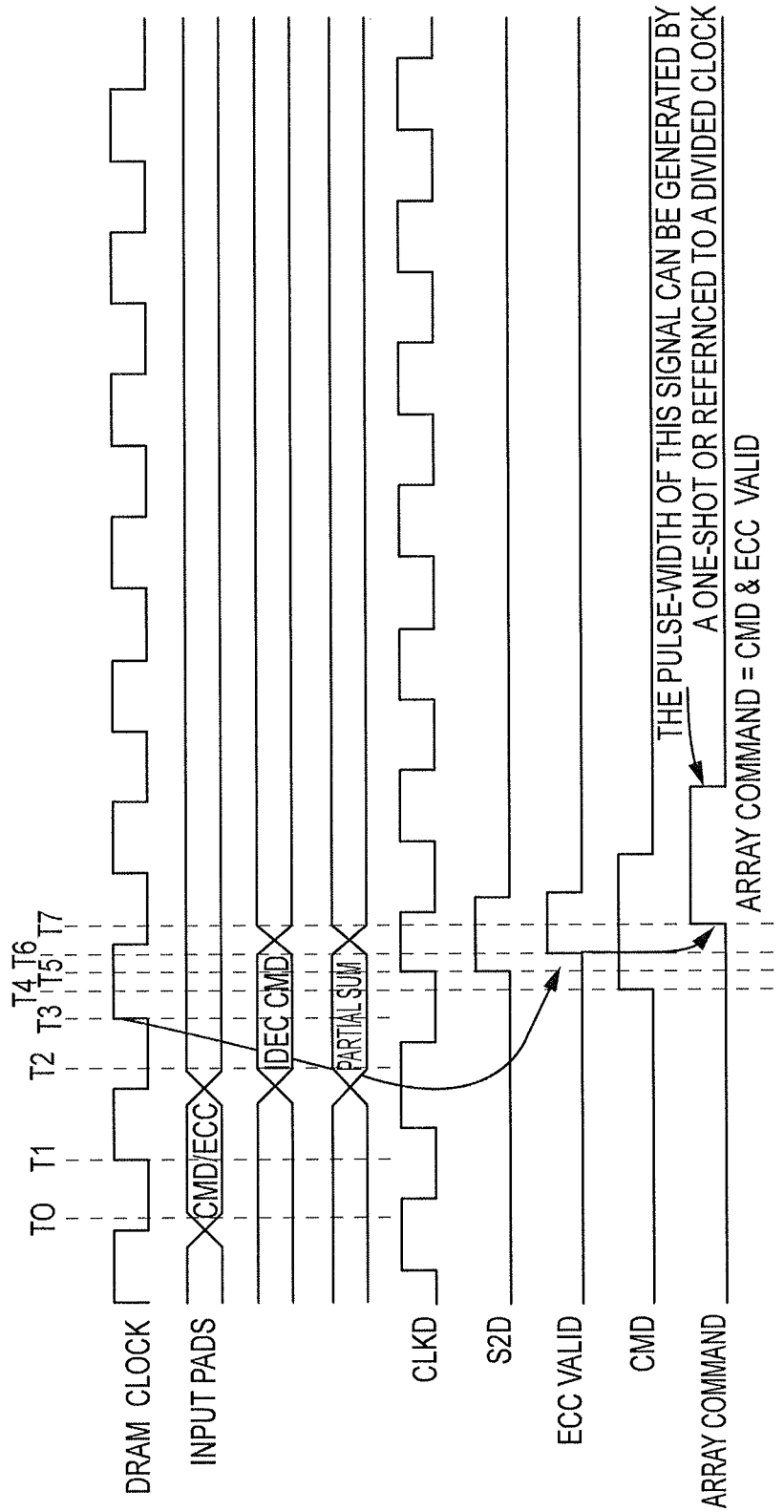
FIG. 5 is a timing diagram representative of the time to calculate error code value in accordance with one embodiment of the invention.

The logic path of FIGS. 3 and 4 calculates and compares the ECC value in less time than it takes in the prior art logic path shown in FIG. 1. A timing diagram in accordance with the logic path in FIG. 4 is shown in FIG. 5. The timing events T0-T2 in the timing diagram of FIG. 5 represents the same timing events T0-T2 of FIG. 2, and therefore, will not be repeated in the interest of brevity. At time T3, however, the terms of the partial sum are clocked into the set of dynamic logic gates 134 and provided to a plurality of S2D circuits 136a. As stated above, the dynamic logic gates 134 calculate the remaining part of the ECC value and compare the calculated ECC value with the transmitted ECC value. At time T4 the decoded command signal is provided to the ECC valid logic 120. At time T5 and in response to a rising edge of S2D 136b clkD, the monotonic signals are clocked out of the S2Ds 136a. At time T6 and when the calculated ECC value matches the transmitted ECC value, an ECC valid signal is provided to ECC valid logic 120. The ECC valid signal may be provided to ECC valid logic 120 at a different time than the decoded command signal is provided to ECC valid logic 120. Finally, at time T7 ECC valid logic 120 generates and provides an array command signal to the memory array. The array command signal is generated and provided to the memory array in less time than it takes in the prior art timing diagram of FIG. 2.

Although FIGS. 3 and 4 show a write command, the logic path 130 is also applicable to a read command issued by a memory controller. In a read command, the logic path 130 would verify the read command and read address on the memory device before providing access to the memory array. Furthermore, the logic path 130 is also applicable to a read packet received by a memory controller from a memory device. Once the read packet was received by the memory controller, the logic path 130 on the memory controller verifies the read data transmitted from the memory device to the memory controller.

Figure 6:
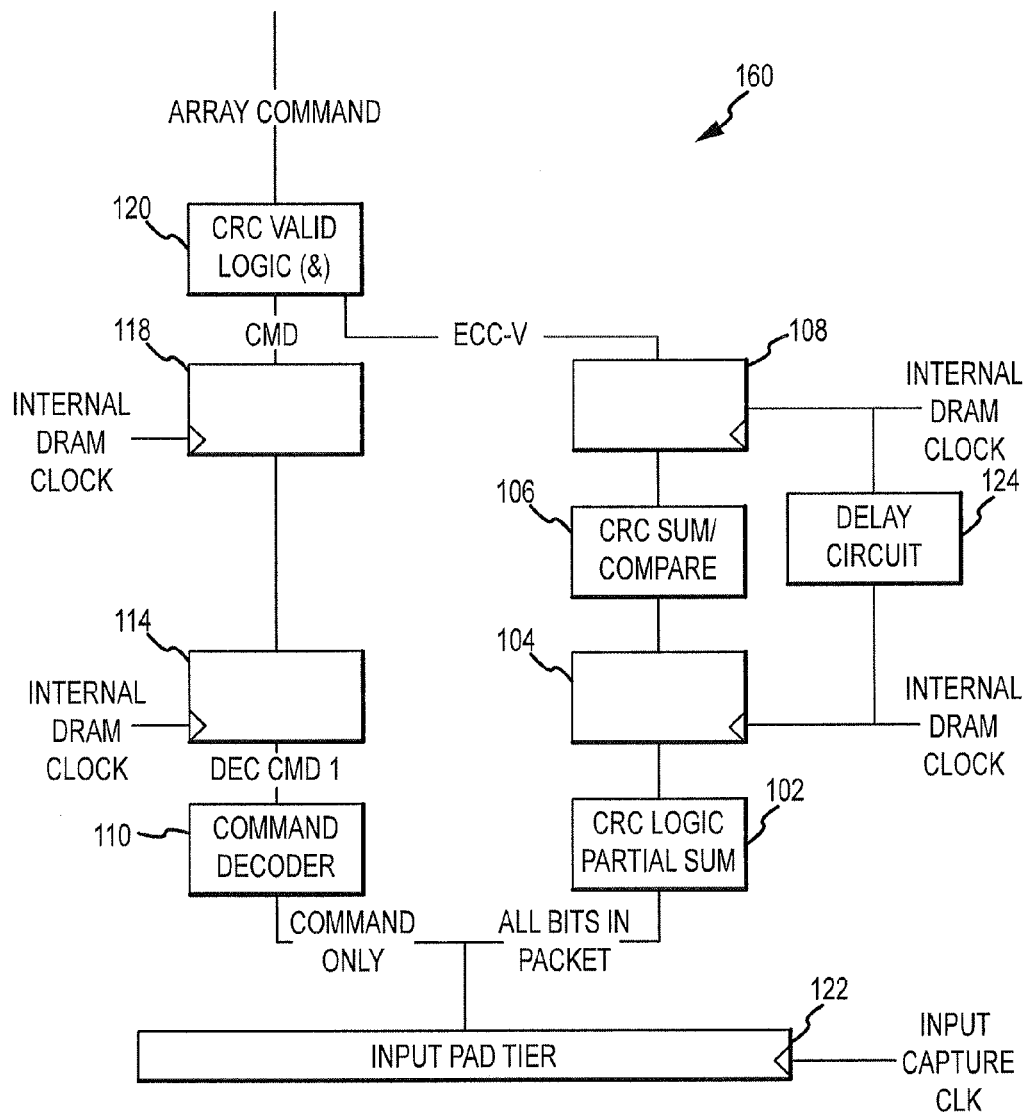
FIG. 6 is a block diagram of the logic path for calculating an error code according to one embodiment of the invention.

In another embodiment of the invention, an alternative logic path may be used. FIG. 6 shows the logic path of FIG. 1, but further includes a delay circuit between the first and second clock cycle of the internal memory clock. More particularly, the logic path 160 includes two static logic gates that are clocked by respective flip flops 104 and 108. The first flip flop 104 is clocked by a first internal clock, similar to the internal clock of FIG. 1. The second flip flop 108 is clocked by a delayed internal clock. The delay circuit 124 used to delay the internal clock may be any type of delay circuit. The minimum amount of delay that may be applied to the delay circuit 124 is likely greater than the time it takes the ECC valid signal to be output the second set of static logic gates 106. Conversely, the maximum amount of delay that may be applied to the delay circuit 124 is likely less than the time marker for when the ECC valid signal is clocked into valid logic. Therefore, the amount of delay will not be longer than one clock period; however, the delay may be close to one clock period.

Figure 7:
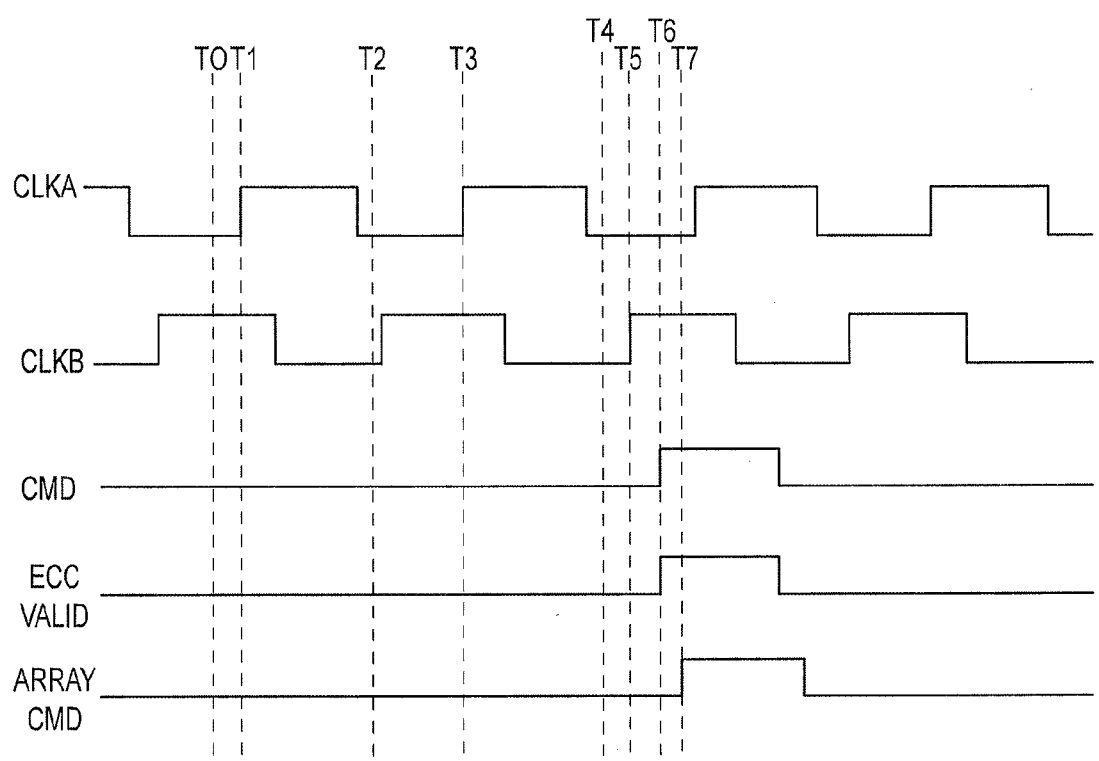
FIG. 7 is a timing diagram representative of the time to calculate error code value in accordance with one embodiment of the invention.

A timing diagram for the logic path of FIG. 6 in accordance with one embodiment is shown in FIG. 7. FIG. 7 shows two clock signals, clock signal A and delayed clock signal B, where delayed clock signal B lags clock signal A by about 70%. Although FIG. 7 shows a delay of 70%, other delay amounts may be used. Clock signal A represents a clock signal similar to the clock signal in FIG. 2. Furthermore time markers T0-T4 are in response to clock signal A and represent the same timing events as in FIG. 2. Therefore, time markers T0-T4 will not be repeated for the sake of brevity. Time marker T5, however, is in response to clock signal B. In particular, at time T5 and in response to the rising edge of clock signal B, the ECC valid signal is clocked out of the second flip flop 108. At time T6 a decoded command signal and ECC valid signal are provided to ECC valid logic 120. The ECC valid logic 120 generates array command signal, which provides access to the memory array. Therefore, the time it takes to calculate and compare the ECC value is much less with the delay circuit 124 than without a delay circuit.

Figure 8:
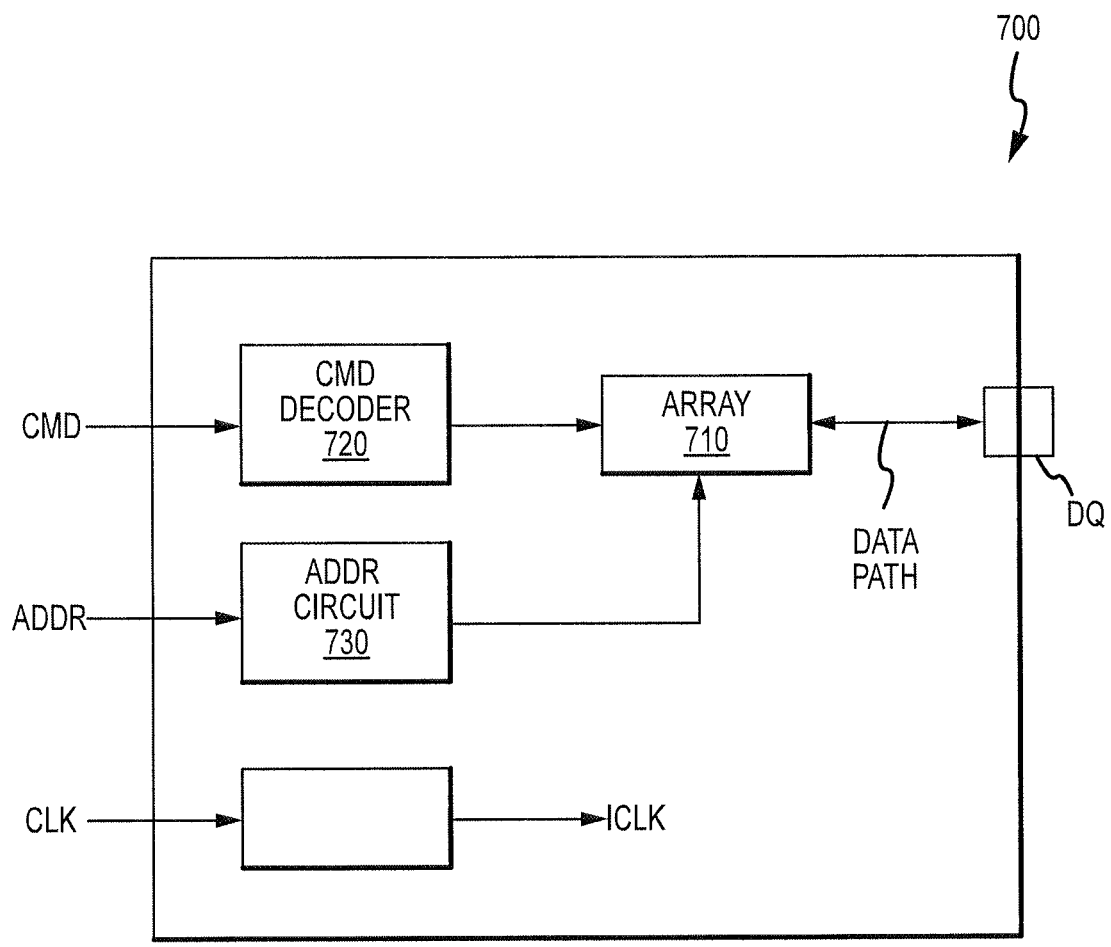
FIG. 8 is a block diagram of a memory device using a logic path for calculating an error code according to one embodiment of the invention.

FIG. 8 shows a memory device 700 according to one embodiment of the invention. The memory device 700 is a dynamic random access ("DRAM"), although the principles described herein are applicable to DRAM cells, Flash or some other memory device that receives memory commands. The memory device 700 includes a command decoder 720 that generates sets of control signals corresponding to respective commands to perform operations in memory device 700, such as writing data to or reading data from the memory device. The memory device 700 further includes an address circuit 730 that selects the corresponding row and column in the array. Both the command signals and address signals are typically provided by an external circuit such as a memory controller (not shown). The memory device 700 further includes an array 710 of memory cells arranged in rows and columns. The array 710 may be accessed on a row-by-row, page-by-page or bank-by-bank basis as will be appreciated by one skilled in the art. The command decoder 720 provides the decoded commands to the array 710, and the address circuit 730 provides the row and column address to the array 710. Data is provided to and from the memory device 700 via a data path. The data path is a bidirectional data bus. During a write operation write data are transferred from a data bus terminal DQ to the array 710 and during a read operation read data are transferred from the array to the data bus terminal DQ.

Figure 9:
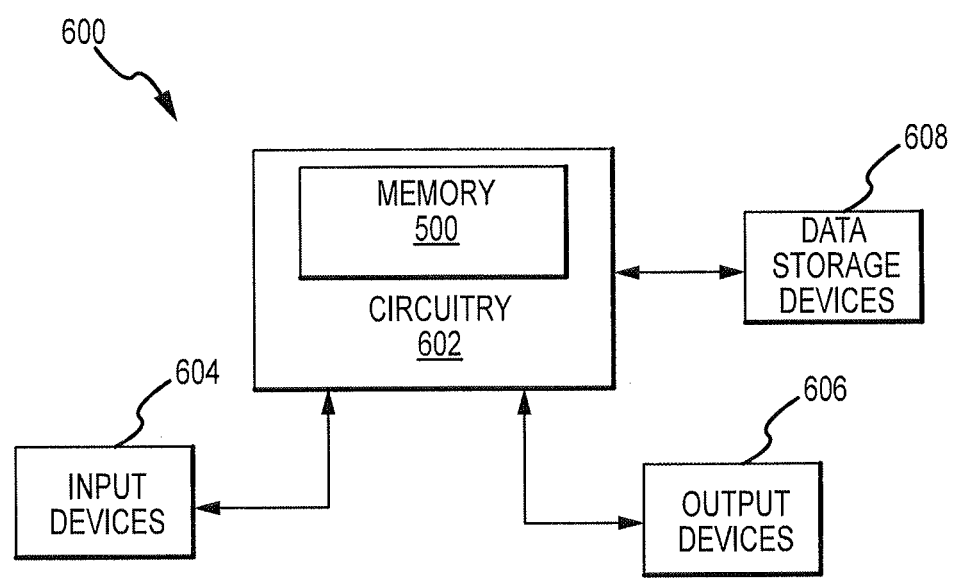
FIG. 9 is a block diagram of an embodiment of a processor based system using the memory device of FIG. 8.

FIG. 9 is a block diagram of an embodiment of a processor-based system 600 including processor circuitry 602, which includes the memory device 500 of FIG. 6 or a memory device according to some other embodiment of the invention. Conventionally, the processor circuitry 602 is coupled through address, data, and control buses to the memory device 500 to provide for writing data to and reading data from the memory device 500. The processor circuitry 602 includes circuitry for performing various processing functions, such as executing specific software to perform specific calculations or tasks. In addition, the processor-based system 600 includes one or more input devices 604, such as a keyboard or a mouse, coupled to the processor circuitry 602 to allow an operator to interface with the processor-based system 600. Typically, the processor-based system 600 also includes one or more output devices 606 coupled to the processor circuitry 602, such as output devices typically including a printer and a video terminal. One or more data storage devices 608 are also typically coupled to the processor circuitry 602 to store data or retrieve data from external storage media (not shown). Examples of typical storage devices 608 include hard and floppy disks, tape cassettes, compact disk read-only ("CD-ROMs") and compact disk read-write ("CD-RW") memories, and digital video disks ("DVDs").

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

I claim:

1. In a memory system, a method of evaluating signals, comprising:
   receiving a plurality of signals;
   decoding a command from command signals of the received signals;
   receiving signals corresponding to a transmitted error correcting code;
   calculating a part of a generated error correcting code from at least some of the received signals;
   completing the calculation of the generated error correcting code from the calculated part of the error correcting code;
   comparing the calculated error correcting code with the transmitted error correcting code;
   providing the command to error correcting code logic responsive to a clock signal; and
   if the calculated error correcting code matches the transmitted error correcting code, providing a valid signal to the error correcting code logic at a different time than the command to output the command asynchronously with any clock signal as the comparison is completed.

2. The method of claim 1, wherein the act of completing the calculation of the generated error correcting code comprises completing the calculation of the generated error correcting code responsive to a transition of a clock signal after the calculation of part of the error correcting code has been completed.

3. The method of claim 1, wherein the act of calculating a part of a generated error correcting code comprises calculating a part of a generated error correcting code asynchronously with any clock signal as the signals are received.

4. The method of claim 1, wherein the error correcting code comprises a cyclic redundancy check.

5. The method of claim 1, wherein the act of completing the calculation of the generated error correcting code comprises:
  generating monotonic signals from the calculated part of the error correcting code; and
  processing the monotonic signals to complete the calculation of the generated error correcting code.

6. The method of claim 1, wherein the memory system comprises a memory device.

7. The method of claim 1, wherein the received signals comprise command, address and write data signals, the act of outputting at least some of the received signals asynchronously with any clock signal as the comparison is completed comprise outputting the command signals asynchronously with any clock signal as the comparison is completed.

8. The method of claim 7, further comprising:
  decoding the command signals while the partial calculation and the completed calculations are being performed; and
  outputting the decoded command signal asynchronously with any clock signal as the comparison is completed.

9. The method of claim 8, further comprising suppressing the outputting of the command signals when the calculated error correcting code value does not match the transmitted error correcting code value.

10. A logic path for accessing a memory array within a memory device, comprising:
  a first input configured to receive signals corresponding to a transmitted error correcting code;
  a static logic circuit coupled to the input, the static logic circuit configured to calculate a part of a generated error correcting code from at least some of the received signals, wherein the calculation for the part of the generated error correcting code is asynchronous with any clock signal as the received signals are received; and
  a dynamic logic circuit coupled to the static logic circuit, the dynamic logic circuit configured to receive the part of the generated error correcting code and to calculate the generated error correcting code from the part of the generated error correcting code, the dynamic logic circuit further configured to compare the generated error correcting code with the transmitted error correcting code, and the dynamic logic circuit further configured to responsive to completion of the comparison and asynchronous to a clock signal, provide a valid signal conditioned upon the generated error correcting code matching the transmitted error correcting code.

11. The logic path of claim 10, further comprising a command decoder coupled to the input, the command decoder configured to generate decoded commands from at least some of the received signals.

12. The logic path of claim 10, further comprising an error correcting code valid logic configured to provide the decoded commands to a memory array responsive the valid signal.

13. The logic path of claim 12, wherein the decoded command signals are provided to the error correcting code valid logic responsive to the clock signal.

14. The logic path of claim 13, wherein the an error correcting code valid logic is configured to receive the decoded commands asynchronously from the valid signal.

15. A method, comprising:
  receiving data and a first error correcting code at a logic path;
  calculating a partial sum of terms based on the data;
  calculating a second error correcting code based on the partial sum of terms;
  comparing the second error correcting code with the first error correcting code; and
  responsive to completion of the comparison, providing, to an error correcting code valid gate of the logic path without intermediate latching, a validity signal having a valid value conditioned upon the second error correcting code matching the first error correcting code.

16. The method of claim 15, further comprising responsive to completion of the comparison, outputting, to the error correcting code valid gate, the validity signal having an invalid value conditioned upon a mismatch between the second error correcting code and the first error correcting code.

17. The method of claim 15, further comprising decoding the data to generate decoded commands.

18. The method of claim 17, further comprising providing the decoded commands to the error correcting code valid gate responsive to a clock signal.

19. The method of claim 18, further comprising outputting the decoded commands from the error correcting code valid gate responsive to receiving the valid signal having the valid value.

20. The method of claim 18 further comprising suppressing output of the decoded commands from the error correcting code valid gate responsive to receiving the valid signal having an invalid value.

* * * * *

UNITED STATES PATENT AND TRADEMARK OFFICE
CERTIFICATE OF CORRECTION

| | | |
|---|---|---|
| PATENT NO. | : 8,555,127 B2 | Page 1 of 1 |
| APPLICATION NO. | : 13/731658 | |
| DATED | : October 8, 2013 | |
| INVENTOR(S) | : James B. Johnson | |

It is certified that error appears in the above-identified patent and that said Letters Patent is hereby corrected as shown below:

In the Claims

In column 8, line 16, in Claim 14, delete "the an" and insert -- an --, therefor.

Signed and Sealed this
Twenty-eighth Day of January, 2014

Michelle K. Lee
*Deputy Director of the United States Patent and Trademark Office*